(12) United States Patent
Qian et al.

(10) Patent No.: US 7,190,612 B2
(45) Date of Patent: Mar. 13, 2007

(54) CIRCUITRY FOR USE IN CURRENT SWITCHING A MAGNETIC CELL

(75) Inventors: Zhenghong Qian, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 26 days.

(21) Appl. No.: 11/096,626

(22) Filed: Mar. 31, 2005

(65) Prior Publication Data
US 2006/0221676 A1    Oct. 5, 2006

(51) Int. Cl.
*G11C 11/00*    (2006.01)
(52) U.S. Cl. ..................................... 365/158
(58) Field of Classification Search ................. 365/158
See application file for complete search history.

(56) References Cited

U.S. PATENT DOCUMENTS

| | | | |
|---|---|---|---|
| 6,552,927 B2 | 4/2003 | Naji | |
| 6,714,444 B2 | 3/2004 | Huai et al. | |
| 6,839,270 B2 * | 1/2005 | Perner et al. | 365/158 |
| 6,862,235 B2 * | 3/2005 | Sakata et al. | 365/202 |
| 2004/0095802 A1 * | 5/2004 | Tran | 365/158 |
| 2005/0232001 A1 * | 10/2005 | Tsuji | 365/158 |

OTHER PUBLICATIONS

John DeBrosse, et al., *A High-Speed 128-kb MRAM Core for Future Universal Memory Applications*, IEEE Journal of Solid-State Circuits, vol. 39, No. 4, Apr. 2004, pp. 678-683.

* cited by examiner

*Primary Examiner*—Amir Zarabian
*Assistant Examiner*—Anthan Tran
(74) *Attorney, Agent, or Firm*—Sawyer Law Group LLP (57) ABSTRACT

A method and system for providing a magnetic memory is described. The method and system include providing a plurality of magnetic storage cells, providing a bit line, providing a plurality of word lines, providing bit line read/write logic, and providing a plurality of switches for the bit line. Each of the magnetic storage cells includes a magnetic storage element capable of being programmed by a write current driven through the magnetic storage element. The bit line corresponds to the magnetic storage cells. Each of the word lines corresponds to a magnetic storage cell of the magnetic storage cells and allows current to flow through the magnetic storage cell. The bit line read/write logic corresponds to the bit line. The switches are for the bit line and controlled by the bit line read/write logic to selectively provide a read current or the write current to the magnetic storage elements.

15 Claims, 5 Drawing Sheets

CIRCUITRY FOR USE IN CURRENT SWITCHING A MAGNETIC CELL

FIELD OF THE INVENTION

The present invention relates to magnetic memory systems, and more particularly to a method and system for providing circuitry for use in switching a magnetic memory cell that can be switched using a spin transfer effect.

BACKGROUND OF THE INVENTION

Figure 1:
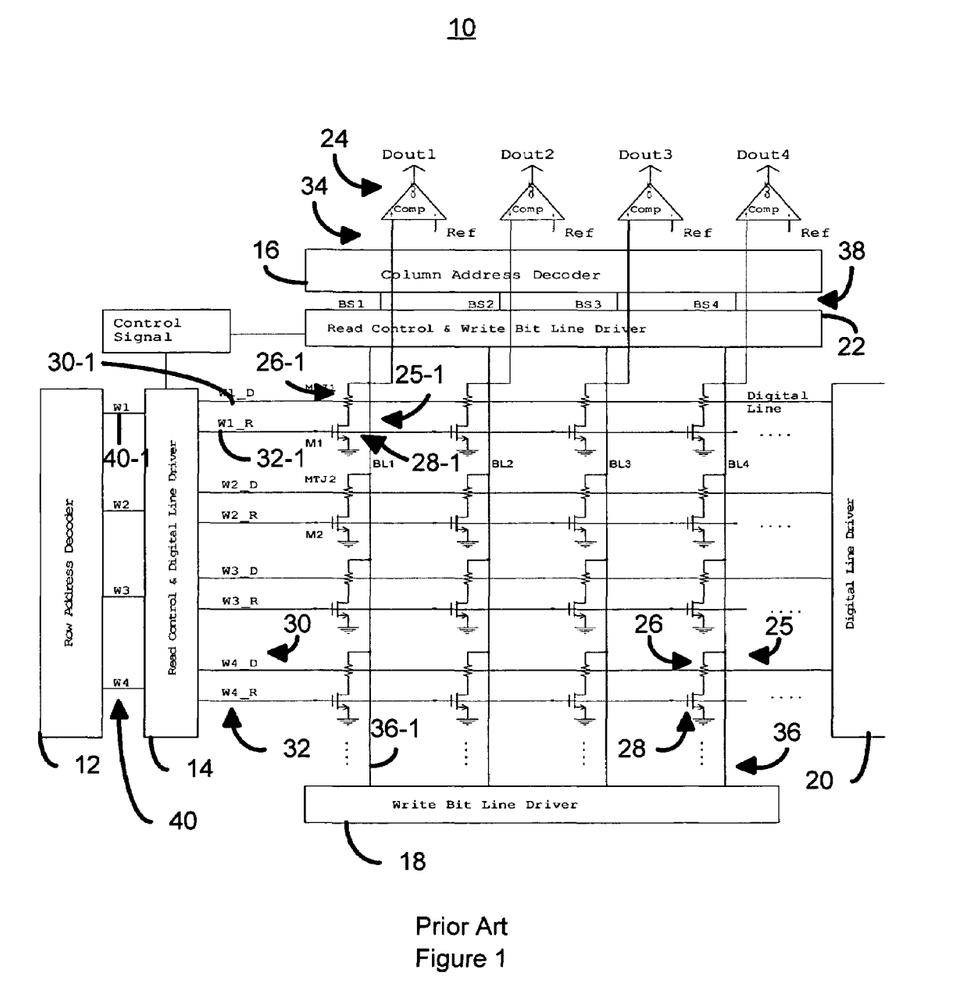
FIG. 1 is a diagram of a conventional magnetic random access memory.

FIG. 1 depicts a conventional magnetic random access memory (MRAM) 10. The conventional MRAM 10 includes a row address decoder 12, a read control and digital line driver 14, a column address decoder 16, a write bit line driver 18, a digital line driver 20, a read control and write bit line driver 22, comparators 24, magnetic storage cells 25 each of which includes a magnetic tunneling junction (MTJ) 26 and a transistor 28, digital lines 30, word read lines 32, bit sense lines 34, bit lines 36, bit select lines 38, and word lines 40. In the conventional MRAM 10, the MTJ 26 has a free layer, an insulating tunneling barrier layer, and a pinned layer. Use of a conventional MTJ stack makes it possible to design an MRAM cell with high integration density, high read/write speed, and low read power.

The conventional MRAM 10 utilizes the digital lines 30, word read lines 32, bit sense lines 34, bit lines 36, bit select lines 38, and word lines 40 to program a magnetic storage cell 25. In order to describe the operation of the conventional MRAM 10, reading and programming of a particular magnetic storage cell 25, the magnetic storage cell 25-1, will be described. However, one of ordinary skill in the art will readily recognize that the conventional MRAM 10 functions similarly for writing to another cell. One of ordinary skill in the art will readily recognize that by driving the lines 30 and 36, the conventional MRAM 10 can write in parallel, and through the lines 34 and 36, the conventional MRAM 10 can read cells in parallel.

To write a data into the magnetic storage cell 25-1, a particular word line 40, the word line 40-1, is selected first. Similarly, a particular bit select line 38, bit select line 38-1, is also selected. Because the word line 40-1 is selected, a write current is passed through a corresponding digit line 30, the digital line 30-1, using the read control and digital line driver 14 and digital line driver 20. The direction of current driven through the digital line depends upon whether the data to be input corresponds to writing a digital "0" or a digital "1". Through write bit line driver 18, another write current is driven through an appropriate bit line 36, the bit line 36-1. The currents from the digital line 30-1 and bit line 36-1 cross at or near the MTJ 26. A combined magnetic field produced is sufficiently large to switch the magnetization direction of the free layer of the MTJ 26. Thus the combined magnetic field defines the state (for example either logical "0" or a logical "1") of the memory cell. Note at high density, this combined field may disturb the adjacent magnetic cells.

To read the data stored in the storage cell 25-1, the word line 30-1 and bit select line 38-1 are selected. Using the read control and digital line driver 14, line 32-1 is driven and the transistor 28 for the storage cell 25-1 turned on. A read current then passes via the bit line 36-1 through the MTJ 26 and transistor 28 to ground. Consequently, stored data is read by sensing the voltage on the appropriate line, line 36-1 through the sense line 34-1.

Although the conventional MRAM functions 10, one of ordinary skill in the art will readily recognize that there are drawbacks. Programming, for example for each storage cell 25, uses magnetic fields due to current driven through the corresponding lines, such as lines 30 and 36. The magnetic fields are not a localized phenomenon. In addition, a relatively large current corresponding to a relatively large magnetic field is used to program the storage cells 25. Consequently, the nearby cells may be disturbed or inadvertently written. As a result, performance of the conventional MRAM 10 suffers.

Accordingly, what is needed is a magnetic memory having improved performance. The present invention addresses such a need.

BRIEF SUMMARY OF THE INVENTION

The present invention provides a method and system for providing a magnetic memory. The method and system comprise providing a plurality of magnetic storage cells, providing a bit line, providing a plurality of word lines, providing bit line read/write logic, and providing a plurality of switches for the bit line. Each of the plurality of magnetic storage cells comprises a magnetic storage element capable of being programmed by a write current driven through the magnetic storage element. The bit line corresponds to the plurality of magnetic storage cells. Each of the plurality of word lines corresponds to a magnetic storage cell of the plurality of magnetic storage cells and allows current to flow through the magnetic storage cell. The bit line read/write logic corresponds to the bit line. The plurality of switches is for the bit line. The plurality of switches are controlled by the bit line read/write logic to selectively provide a read current or the write current to the plurality of magnetic storage elements.

According to the method and system disclosed herein, the present invention provides a mechanism for programming and reading a magnetic memory including magnetic elements that are programmable by a write current driven through the magnetic elements, for example through the phenomenon of spin transfer.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In order to overcome some of the issues associated with conventional magnetic memories having a higher density of memory cells, a recently discovered phenomenon, spin transfer, may be utilized. The spin-transfer effect arises from the spin-dependent electron transport properties of ferromagnetic-normal metal multilayers. When a spin-polarized current traverses a magnetic multiplayer in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^6$–$10^8$ A/cm$^2$).

The phenomenon of spin transfer can be used in the CPP configuration as an alternative to or in addition to using an external switching field to switch the direction of magnetization of the free layer of a magnetic element, such as a spin valve or an MTJ, such as the conventional 26. To program the magnetic element to a first state, such as a logical "0", current is driven through the magnetic element in a first direction. To program the magnetic element to a second state, such as a logical "1", current is driven through the magnetic element in the opposite direction.

Although magnetic elements utilizing spin transfer as a programming mechanism can be used in principle, conventional circuitry, such as that depicted in FIG. 1, is inappropriate for use for such memories. Consequently, a mechanism for using such magnetic storage elements in a memory is desired.

The present invention provides a method and system for providing a magnetic memory. The method and system comprise providing a plurality of magnetic storage cells, providing a bit line, providing a plurality of word lines, providing bit line read/write logic, and providing a plurality of switches for the bit line. Each of the plurality of magnetic storage cells comprises a magnetic storage element capable of being programmed by a write current driven through the magnetic storage element. The bit line corresponds to the plurality of magnetic storage cells. Each of the plurality of word lines corresponds to a magnetic storage cell of the plurality of magnetic storage cells and allows current to flow through the magnetic storage cell. The bit line read/write logic corresponds to the bit line. The plurality of switches is for the bit line. The plurality of switches are controlled by the bit line read/write logic to selectively provide a read current or the write current to the plurality of magnetic storage elements.

The present invention is described in the context of particular magnetic memories having certain components, such as row and column decoders and magnetic storage cells including multiple components. One of ordinary skill in the art will readily recognize that the present invention is consistent with the use of magnetic memories having other and/or additional components. Furthermore, the present invention is described in the context of components corresponding certain portions of the memory. For example, certain logic is described as corresponding to a bit-line and the row decoder is described in the context of corresponding to four word lines. However, one of ordinary skill in the art will readily recognize that the components could correspond to another number of elements. The method and system in accordance with the present invention are also described in the context of reading from or writing to a single magnetic storage cell. However, one of ordinary skill in the art will readily recognize that the method and system can be extended to read form and/or write to multiple magnetic storage cells substantially in parallel. Finally, the present invention is described in the context of certain memories. However, one of ordinary skill in the art will readily recognize that the present invention is compatible with memories not inconsistent with the present invention.

Figure 2:
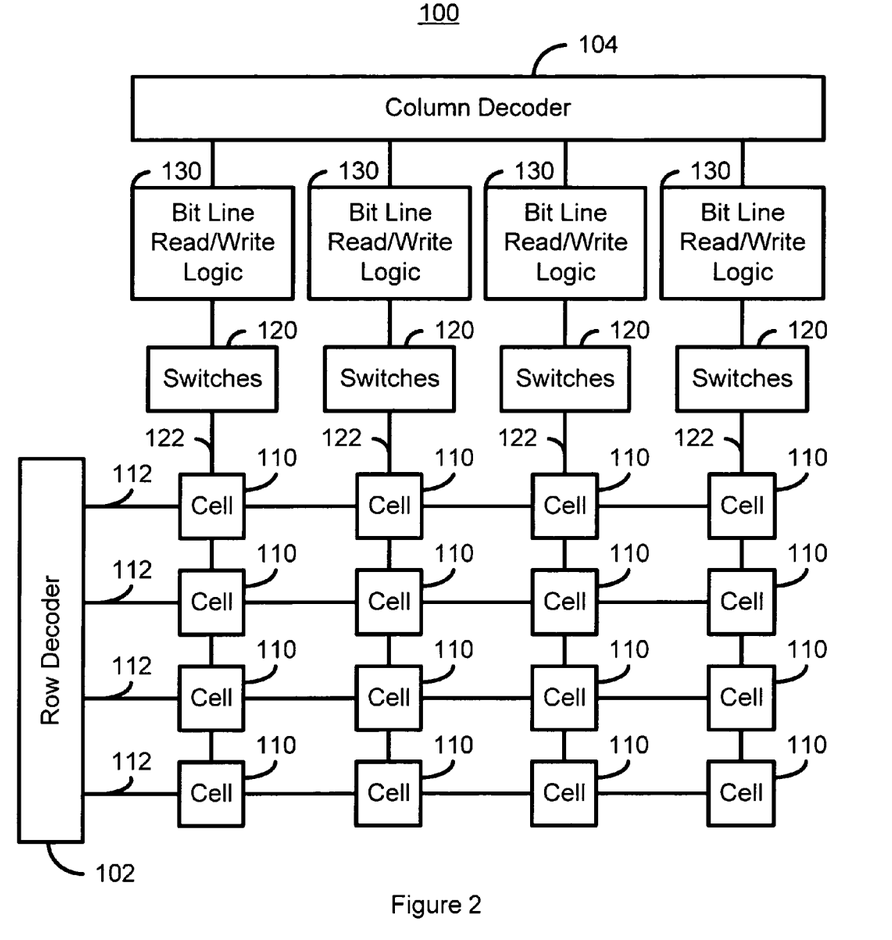
FIG. 2 is a high-level diagram of a portion of one embodiment of a magnetic memory in accordance with the present invention.

FIG. 2 is a high-level diagram of a portion of one embodiment of a magnetic memory 100 in accordance with the present invention. The magnetic memory 100 is preferably an MRAM. The magnetic memory 100 includes row decoder 102, column decoder 104, magnetic storage cells 110, word lines 112, switches 120, bit lines 122, and bit line read/write logic 130. Each of the magnetic storage cells 110 includes a magnetic storage element (not explicitly shown) that can be programmed by a current driven through the magnetic storage element. Such magnetic elements may, for example, utilize the spin transfer effect as a switching mechanism. The magnetic storage element is also preferably a magnetoresistive element having a resistance that depends upon the magnetic state and, therefore, the data stored in the magnetic storage element. The magnetic storage cells 10 may include other components. For example, in a preferred embodiment, each magnetic storage cell 110 also includes at least one transistor (not shown).

The magnetic storage cells 110 are arranged in an array having rows and columns. The row decoder 102 selects one or more of the word lines 112, while the column decoder 104 corresponds to selecting one or more of the bit lines 122. Selection of a word line 112 corresponds to allowing current to flow through at least one of the magnetic storage cells 110 in the row. The bit line read/write logic 130 corresponds to the bit line 122. In the embodiment shown, bit line read/write logic 130 corresponds to a single bit line 122. However, nothing prevents the bit line read/write logic 130 from being used with multiple bit lines. The plurality of switches is for the bit line. The switches 120 are controlled by the bit line read/write logic 130. The switches 120 selectively provide a read current or a write current through the bit line 122 to the plurality of magnetic storage elements. Stated differently, the switches 120 allow the read or write current to be provided through the bit line 122 to selected magnetic storage element(s). In the embodiment shown, switches 120 correspond to a single bit line 122. However, nothing prevents the switches 120 from being used with multiple bit lines. In addition, although depicted in one portion of the bit line 122, nothing prevents the switches 120 from being located at multiple positions, for example at both ends of the bit line 122.

In operation, the row decoder 102 selects a word line 112, which enables at least one of the magnetic storage cells 110 to be written to or read. The column decoder 104 enables the appropriate bit line read/write logic 130. As a result, the switches 120 are controlled to provide the read or write current to the corresponding bit line 122. Note that the read current provided is sufficiently smaller than the write current that reading a particular magnetic storage cell 110 does not result in the cell being inadvertently written. As a result, a single storage cell 110 in the magnetic memory 100 may be programmed or read.

Consequently, magnetic storage elements capable of being programmed by a write current driven through the magnetic storage element can be used in a memory array. For example, magnetic storage elements that employ the spin transfer effect as a switching mechanism can be incorporated into a magnetic memory. Thus, the disadvantages of switching using external magnetic fields, such as inadvertent writing of nearby magnetic storage cells, may be avoided.

Figure 3:
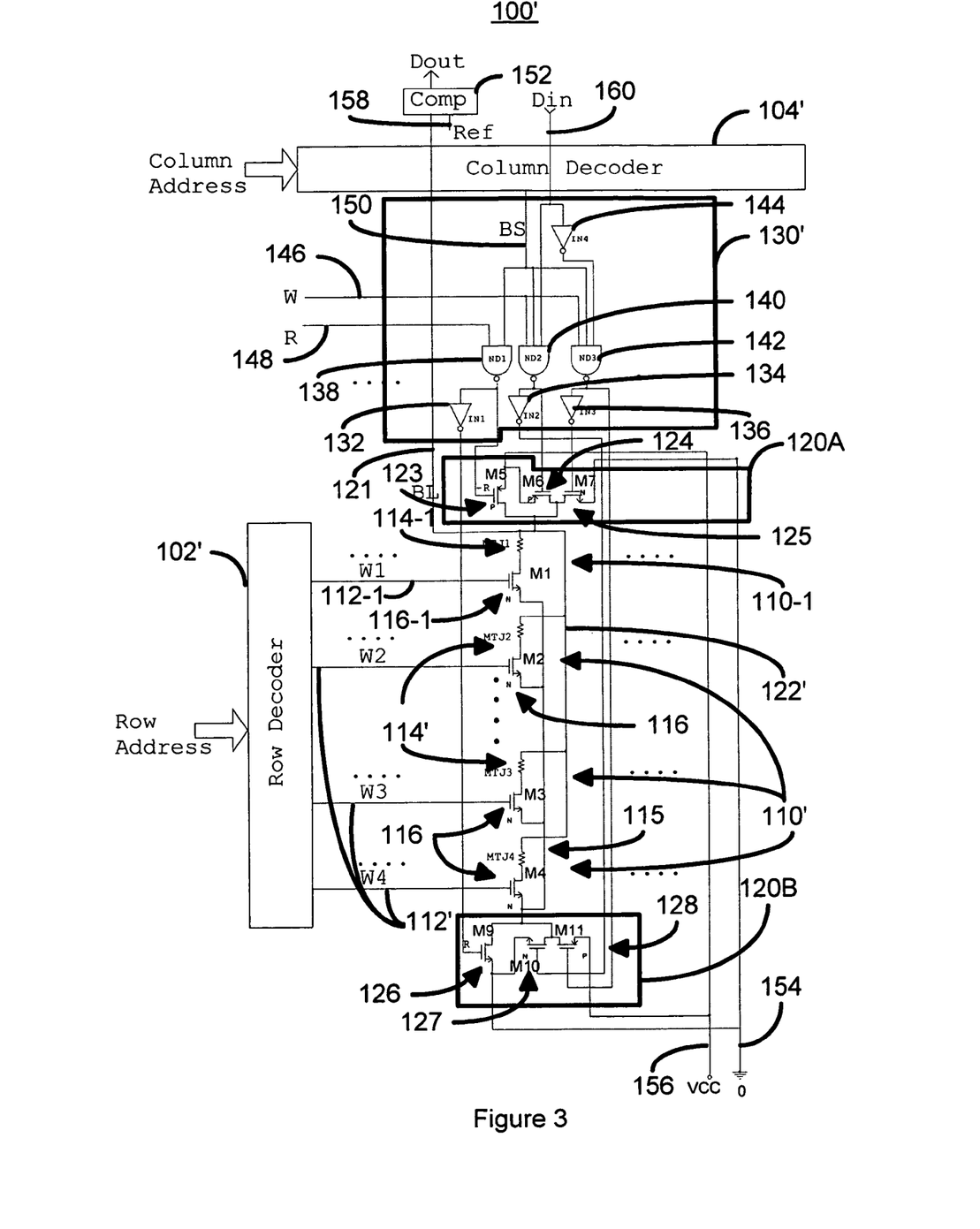
FIG. 3 is a diagram of a portion of another embodiment of a magnetic memory in accordance with the present invention.

FIG. 3 is a diagram of a portion of one embodiment of a magnetic memory 100' in accordance with the present invention. The magnetic memory 100' is preferably an MRAM. The magnetic memory 100' includes components that are analogous to the magnetic memory 100 and are, therefore, labeled similarly. Consequently, the magnetic memory 100' includes row decoder 102', column decoder 104', magnetic storage cells 110', word lines 112', switches 120' that are depicted in groups 120A and 120B, bit lines 122', bit sense line 121, and bit line read/write logic 130'. The magnetic memory 100' also includes write control line 146, read control line 148, bit select line 150, comparator 152, ground line 154, $V_{cc}$ line 156, reference 158, and input data line 160. The bit line read/write logic 130' corresponds to the bit line 122'. In the embodiment shown, bit line read/write logic 130 corresponds to a single bit line 122'. However, nothing prevents the bit line read/write logic 130' from being used with multiple bit lines. The plurality of switches is for the bit line. The switches 120' are controlled by the bit line read/write logic 130'. The switches 120' selectively provide a read current or a write current through the bit line 122' to the plurality of magnetic storage elements. In the embodiment shown, switches 120' correspond to a single bit line 122'. However, nothing prevents the switches 120' from being used with multiple bit lines.

Each of the magnetic storage cells 110' includes a magnetic storage element 114 and a transistor 116. The magnetic storage element 114 can be programmed by a current driven through the magnetic storage element. Such magnetic elements 114 may, for example, utilize the spin transfer effect as a switching mechanism. The magnetic storage element 114 is also preferably a magnetoresistive element having a resistance that depends upon the magnetic state and, therefore, the data stored in the magnetic storage element. The transistor 116 is preferably an N channel MOS transistor. In an alternate embodiment, multiple transistors could be used. Also in another embodiment, P channel transistor(s) might be utilized. The magnetic storage cells 110' may include other components. The magnetic storage cells 110' are arranged in an array having rows and columns.

The bit line read/write logic 130' includes NAND gates 138, 140, and 142, as well as inverters 132, 134, and 136. The outputs of NAND gates 138, 140, and 142 are coupled to the inputs of inverters 132, 134, and 136, respectively. The switches 120' include switches 123, 124, 125, 126, 127, and 128, which are preferably transistors. The transistors 123, 124, and 128 are preferably P channel MOS transistor, while the transistors 125, 126, and 127 are preferably N channel MOS transistors.

The row decoder 102' selects one or more of the word lines 112', preferably by driving the word line 112' high. Selection of a word line 112' enables the transistor 116 in the corresponding magnetic storage cell 110'. The column decoder 104' corresponds to selecting one or more of the bit lines 122'. In the embodiment shown, the column decoder 104' does so by selecting bit select line 150. The bit select line 150 provides a high signal to the NAND gates 138, 140, and 142. Depending upon whether the read control line 148 or write control line 146 is driven high, different ones of the NAND gates 138, 140, and 142 will have a low output. As a result, one or more of the inverters 132, 134, and 136 has a high output. The signal outputs from both the NAND gates and inverters enable the transistors 123, 124, 125, 126, 127, and 128 to selectively provide a read current or a write current through the selected magnetic storage element 114. Note that the read current provided is sufficiently smaller than the write current that reading a particular magnetic storage cell 110' does not result in the cell being inadvertently written.

Operation of the magnetic memory 110' is described in the context of programming or reading a particular magnetic storage cell 110-1. However, the magnetic memory 100' functions in an analogous manner for the remaining magnetic storage cells 110. To read the magnetic storage cell 110-1, a particular word line 112, the word line 112-1, is selected by the row decoder 102'. Consequently, the transistor 116-1 is enabled so that current can flow through the corresponding magnetic storage element 114-1. In addition, the bit select line 150 is driven high. Furthermore, because a read operation is performed, the read line 148 is driven high. Because lines 148 and 150 are both high, the output of the NAND gate 138 will be low. Because the output of the NAND gate 138 is low, the P channel transistor 123 is turned on. In addition, the output of the inverter 132 becomes high. Because the inverter 132 is high, the N channel transistor 126 is turned on. A read current can thus flow through the transistor 123, the magnetic storage element 114-1, the transistor 116-1, and the transistor 126 to ground. In the embodiment shown, the read current is provided from the $V_{cc}$ line 156. The resistance and, therefore, state of the magnetic storage element 116-1 can be detected by comparing the output voltage through the bit sense line 121 to a reference 158 using comparator 152. In one embodiment, if the voltage is low, a logical "0" is stored in the magnetic storage element 114-1. In such an embodiment, if the voltage is high, a logical "1" is stored in the magnetic storage element 114-1. In this read operation, the state voltage is read out through the bit sense line 121 and compared with a reference voltage to determine the stored state, data "0" or data "1".

In a write, or programming, operation for the magnetic storage cell 110-1, a current is also driven through the magnetic storage element 114-1. However, as described above, the minimum write current required to program the magnetic storage elements 114' is preferably significantly larger than the read current used. In addition, in a preferred embodiment, the write current is driven in a first direction (e.g. down in FIG. 3) to write a first state to the magnetic storage element 114', but driven in an opposite direction (e.g. up in FIG. 3) to write a second state to the magnetic storage element. For example, in the embodiment depicted, programming a logical "1" preferably corresponds to driving a write current down in FIG. 3, while programming a logical "0" preferably corresponds to driving a write current up in FIG. 3.

The row decoder 102' still selects the word line 122-1. Similarly, the column decoder 104' still select the bit select line 150, driving the bit select line 150 high. In addition, the write control line 146 is driven high. If the input data is a logical "1", the input data line 160 is high. The combination of the write control line 146, the bit select line 150, and the input data line 160 the output of the NAND gate 140 is low, while the output of the NAND gate 142 is high. Because the output of the NAND gate 140 is low, the P channel transistor 124 is turned on and the inverter 134 is high. The high output from the inverter 134 turns on the N channel transistor 127. Because the transistors 124, 127 are on, a write current will flows to ground down through the magnetic storage element 114-1 and the transistor 116-1. Due to the spin transfer effect, the current passing through the magnetic storage element 114-1 in this direction allows the magnetic storage element 114-1 to switch to/retain a high resistance state corresponding to a logical "1".

If the data to be written is a logical "0", the input data line 160 is low. Thus, the output of the inverter 144 is high. Consequently, the output of the NAND gate 142 is low. Consequently, the P channel transistor 128 is turned on and the inverter 136 has a high output. The high output of the inverter 136 turns on the N channel transistor 125. Because the transistors 125 and 128 are on, a write current will flow to ground upwards through the transistor 116-1 and the magnetic storage element 114-1. Due to the spin transfer effect, the write current flowing in this direction allows the magnetic storage element 114-1 to switch to/retain a low resistance state corresponding to a logical "0".

Thus, a magnetic single storage cell 110' in the magnetic memory 100' may be programmed by driving a write current through the magnetic storage cell 110' or read. Consequently, magnetic storage elements capable of being programmed by a write current driven through the magnetic storage element can be used in a memory array. For example, magnetic storage elements that employ the spin transfer effect as a switching mechanism can be incorporated into a magnetic memory. Thus, the disadvantages of switching using external magnetic fields, such as inadvertent writing of nearby magnetic storage cells, may be avoided.

Figure 4:
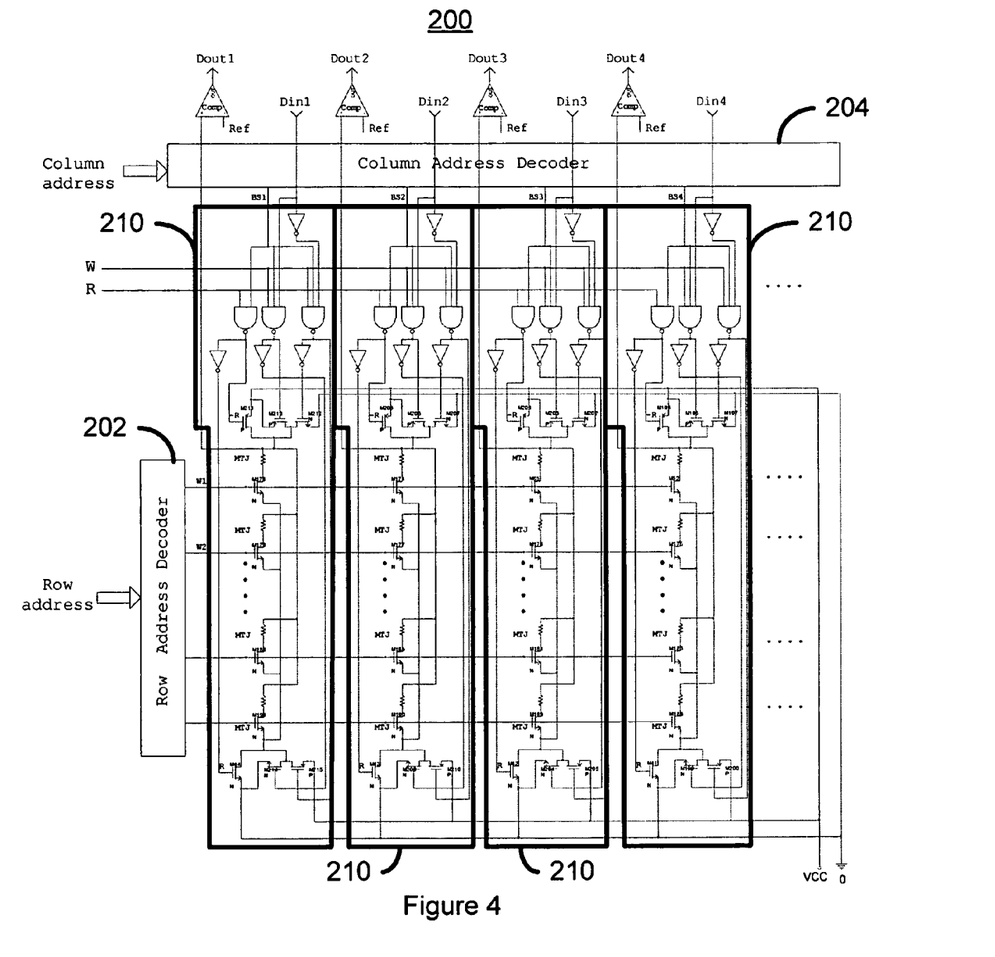
FIG. 4 is a diagram of a portion of another embodiment of a magnetic memory in accordance with the present invention.

FIG. 4 is a diagram of a portion of one embodiment of a magnetic memory 200 in accordance with the present invention. Portions of the magnetic memory 200 are analogous to the magnetic memories 100 and 100'. In particular, the magnetic memory 200 includes segments 210, which correspond to the elements of the magnetic memory 100/100' without the row decoder 102/102' and column decoder 104/104'. Thus, portions of the magnetic memories 100 and 100' corresponding to bit lines 122/122', the corresponding magnetic storage cells 110/110', switches 120/120', and bit line logic 130/130' correspond to the sections 210. Referring back to FIG. 4, the magnetic memory 200 also includes a row decoder 202 and a column decoder 204 which correspond to the row decoder 102/102' and column decoder 104/104', respectively. In addition, although only four rows and columns are depicted, another number of rows and/or columns may be used. Similarly, although only one row decoder 202 and column decoder 204 are depicted, another number of row and/or column decoders may be used with the same or a different number of storage cells.

The magnetic memory 200 functions in an analogous manner to the magnetic memories 100 and 100'. Consequently, the magnetic memory 200 allows magnetic storage elements that are programmed by driving a current through the magnetic storage element to be incorporated into a magnetic memory. Thus, magnetic elements which utilize the spin transfer effect in switching can be used in a magnetic memory.

Figure 5:
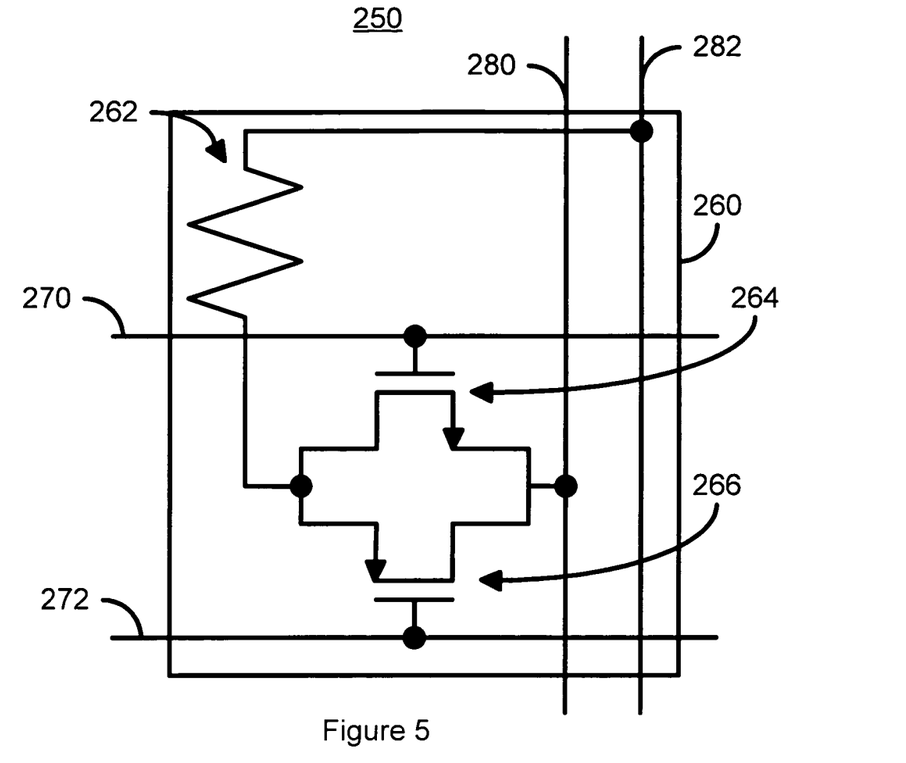
FIG. 5 is a diagram of another embodiment of a magnetic memory in accordance with the present invention.

Referring to FIGS. 3 and 4, in the magnetic memories 100' and 200, the magnitude of the write current traveling down through the magnetic storage element 114' may be larger than that of the write current that travels upward. The asymmetry may occur because the transistor 116' may behave more like a diode when the current is driven upwards. FIG. 5 is a diagram of a portion of one embodiment of a magnetic memory 250 in accordance with the present invention which addresses this asymmetry. The magnetic memory 250 includes a magnetic storage cell 260, write line 270, write line complement 272, bit line 280, and bit line complement 282. The magnetic storage cell 260 includes magnetic storage element 262 and transistors 264 and 266. The transistor 264 is preferably an N channel transistor 264, while the transistor 266 is preferably a P channel transistor. The transistors 264 and 266 may replace the transistor 116 and/or 116'. The magnetic storage cell 260 may replace the storage cell 110 and/or 110'. Similarly, the write line 270 and write line complement 272 may replace a write line 112 and/or 112'. The bit line 280 and bit line complement 282 may also replace the bit line 122 and/or 122'.

In operation, when the word line 270 is driven high, the word line complement 272 is low. Thus, the N channel transistor 264 and P channel transistor 266 may be turned on by the word line 270 and word line complement 272, respectively. The current that is driven downward is provided to the magnetic storage cell 260 through the line 282, while the current that is driven upward is provided to the magnetic storage cell 260 through the line 280. Because the pair of transistors 264 and 266 is used, the write current driven downward in FIG. 5 is substantially the same as the current driven upward.

The magnetic memory 250 shares many of the benefits of the magnetic memories 100, 100', and 200. In addition, the write current for the magnetic memory 250 is balanced. However, the memory density for the magnetic memory 250 may be lower than that of the magnetic memories 100, 100' and 200 because each storage cell 260 contains more components (one magnetic storage element and two transistors) than the magnetic storage cell 110 and 110' (which contain one magnetic storage element and a single transistor).

Figure 6:
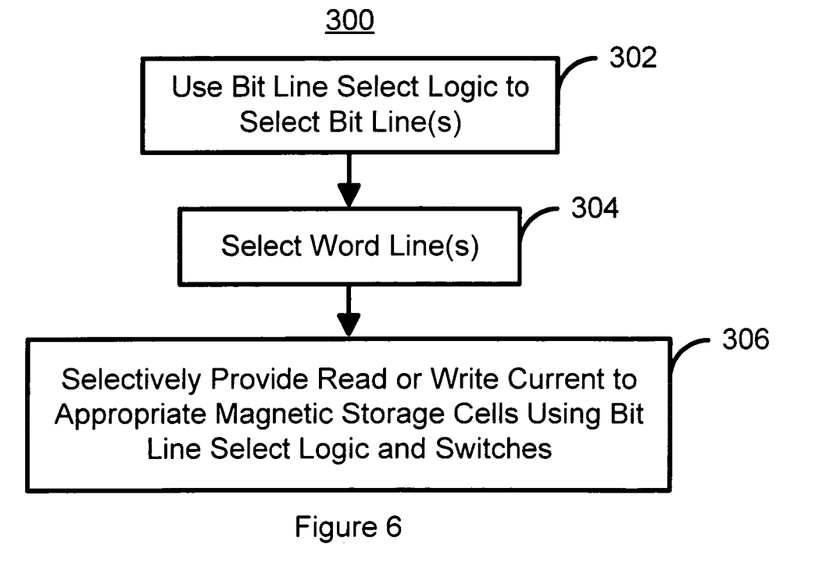
FIG. 6 is a flow chart of one embodiment of a method for utilizing a magnetic memory using in accordance with the present invention.

FIG. 6 is a flow chart of one embodiment of a method 300 for utilizing a magnetic memory using in accordance with the present invention. For clarity, the method 300 is described in the context of the magnetic memory 100'. However, the method 300 might be used in conjunction with the magnetic memory 100, 100', 200 and/or 250. Furthermore, other and/or additional steps may be included. The column decoder 104' is used to select a particular bit line from a number of bit lines. Bit line read/write logic 130' corresponding to the bit line 122' is used to select the bit line 122' and operation, e.g. read or write, via step 302. Step 302 includes enabling a bit select line 150 and providing a read signal via read line 148 or a write signal via write line 146. For writing, step 302 also includes providing driving the input data line 160 high or low, depending upon the data to be written. Note that for the magnetic memory 250, step 302 includes providing the appropriate signals to the lines 280 and 282. As a result, the appropriate NAND gates 138, 140, and 142 and the appropriate inverters 132, 134, and 136 provide a high or low output. At least one word line 112' is selected, via step 304. Note that for the magnetic memory 250, step 304 includes providing the appropriate signals to the lines 270 and 272. Through steps 302 and 304 individual magnetic storage cell(s) 110' are selected for reading or writing. Due to the bit line read/write logic 130' and switches 120', a read or write current is selectively provided through the appropriate switches 120', via step 306. Thus, in step 306 the ones of the transistors 123, 124, 125, 126, 127, and/or 128 are enabled and the current driven through the selected magnetic storage cell(s) 110'. If a write current is provided, then step 306 includes driving the current upward or downward as seen in FIG. 3, depending upon the data to be programmed.

Using the method 200, a magnetic single storage cell 110, 110', or 260 may be read or programmed by driving a write current through the magnetic storage cell 110, 110', or 260. Consequently, magnetic storage elements capable of being programmed by a write current driven through the magnetic storage element can be used in a memory array. For example, magnetic storage elements that employ the spin transfer effect as a switching mechanism can be incorporated into a magnetic memory. Thus, the disadvantages of switching using external magnetic fields, such as inadvertent writing of nearby magnetic storage cells, may be avoided.

A method and system for providing and using circuitry for a magnetic memory has been disclosed. The present invention has been described in accordance with the embodiments shown, and one of ordinary skill in the art will readily recognize that there could be variations to the embodiments, and any variations would be within the spirit and scope of the present invention. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Accordingly, many modifications may be made by one of ordinary skill in the art without departing from the spirit and scope of the appended claims.

We claim:

1. A magnetic memory comprising:
    a plurality of magnetic storage cells, each of the plurality of magnetic storage cells including a magnetic storage element capable of being programmed by a write current driven through the magnetic storage element;
    a bit line corresponding to the plurality of magnetic storage cells;
    a plurality of word lines, each of the plurality of word lines corresponding to a magnetic storage cell of the plurality of magnetic storage cells and for allowing current to flow through the magnetic storage cell;
    bit line read/write logic corresponding to the bit line, the bit line read/write logic including a plurality of NAND gates and a plurality of inverters coupled to the plurality of NAND gates, wherein the plurality of NAND gates includes a first NAND gate having a first output, a second NAND gate having a second output, and a third NAND gate having a third output, and wherein the plurality of inverters further includes a first inverter having a first input coupled to the first output, a second inverter having a second input coupled to the second output, and a third inverter having a third input coupled to the third output; and
    a plurality of switches for the bit line, the plurality of switches being controlled by the bit line read/write logic to selectively provide a read current or the write current to the plurality of magnetic storage elements;
    wherein the plurality of switches further includes
    a first switch controlled by the second NAND gate, a second switch controlled by the third inverter, a third switch controlled by the first inverter, a fourth switch controlled by the third NAND gate, and a fifth switch controlled by the second inverter, the first switch, the second switch, the third switch, the fourth switch, and the fifth switch configured to selectively provide the write current through the plurality of magnetic storage cells.

2. The magnetic memory of claim 1 wherein the plurality of switches further includes:
    a sixth switch controlled by the first NAND gate, the sixth switch and the third switch configured to provide the read current through the plurality of magnetic storage cells.

3. The magnetic memory of claim 2 wherein the first switch, the fourth switch, and the sixth switch are P channel transistors.

4. The magnetic memory claim 3 wherein the second switch, the third switch, and the fifth switch are N channel transistors.

5. The magnetic memory of claim 2 wherein the first switch, the fourth switch, and the sixth switch are P channel transistors and wherein the second switch, the third switch, and the fifth switch are N channel transistors.

6. The magnetic memory of claim 1 wherein each of the plurality of magnetic storage cells further includes a transistor controlled by a word line of the plurality of word lines.

7. The magnetic memory of claim 1 wherein the plurality of word lines includes a first word line and a first word line complement for each of the plurality magnetic storage cells.

8. The magnetic memory of claim 7 wherein each of the plurality of magnetic storage cells further includes a first transistor controlled by the first word line and a second transistor controlled by the first word line complement.

9. A magnetic memory comprising:
    a plurality of magnetic storage cells, each of the plurality of magnetic storage cells including a magnetic storage element capable of being programmed by a write current driven through the magnetic storage element;
    a bit line corresponding to the plurality of magnetic storage cells;
    a plurality of word lines, each of the plurality of word lines corresponding to a magnetic storage cell of the plurality of magnetic storage cells and for allowing current to flow through the magnetic storage cell;
    bit line read/write logic corresponding to the bit line, the bit line read/write logic further including a first NAND gate having a first output, a second NAND gate having a second output, and a third NAND gate having a third output, and wherein the plurality of inverters further includes a first inverter having a first input coupled to the first output, a second inverter having a second input coupled to the second output, and a third inverter having a third input coupled to the third output, the second NAND gate or the third NAND gate providing a low signal during a write if the bit line is selected and a high signal otherwise, the first NAND gate providing a low signal if the bit line is selected during a read and a high signal otherwise; and
    a plurality of transistors corresponding to the bit line, the plurality of transistors being controlled by the bit line read/write logic to selectively provide a read current or the write current to the plurality of magnetic storage elements, the plurality of transistors including a first P channel transistor, a second P channel transistor, a third P channel transistor, a first N channel transistor, a second N channel transistor, and a third N channel transistor, the second P channel transistor controlled by the second NAND gate, the first N channel transistor controlled by the third inverter, the second N channel transistor controlled by the first inverter, the third P channel transistor controlled by the third NAND gate, the third N channel transistor controlled by the second inverter, and the first P channel transistor controlled by the first NAND gate, the second P channel transistor and the third N channel transistor being configured to selectively provide the read current through the plurality of magnetic storage cells in a first direction, the third P channel transistor and the second N channel transistor configured to selectively provide the write current through the plurality of magnetic storage cells in a second direction different from the first direction, the first P channel transistor and the second N channel transistor configured to provide the read current through the plurality of magnetic storage cells.

10. A method for utilizing a magnetic memory, the magnetic memory including a plurality of magnetic storage cells, each of the plurality of magnetic storage cells including a magnetic storage element capable of being programmed by a write current driven through the magnetic storage element, the magnetic memory also including the comprising:

utilizing bit line read/write logic corresponding to the bit line to select a bit line of a plurality of bit lines, the bit line corresponding to a first portion of the plurality of magnetic storage cells, wherein the bit line read/write logic further includes a plurality of NAND gates and a plurality of inverters coupled to the plurality of NAND gates, wherein the plurality of NAND gates includes a first NAND gate having a first output, a second NAND gate having a second output, and a third NAND gate having a third output, and wherein the plurality of inverters further includes a first inverter having a first input coupled to the first output, a second inverter having a second input coupled to the second output, and a third inverter having a third input coupled to the third output, wherein the utilizing further includes enabling a portion of the plurality of NAND gates through a bit line select and either a read signal or a write signal, and providing a low output from either the second NAND gate or the third NAND gate provide when the bit line is selected for writing and a high output from each of the second NAND gate and the third NAND gate otherwise;

selecting at least one of a plurality of word lines, each of the plurality of word lines corresponding to a second portion of the plurality of magnetic storage cells and for allowing current to flow through at least one of the second portion of the plurality of magnetic storage cells if a corresponding bit line is selected; and selectively providing a read current or the write current to the plurality of magnetic storage elements using a plurality of switches for the bit line, the plurality of switches being controlled by the bit line read/write logic wherein the plurality of switches further includes a first switch controlled by the second NAND gate, a second switch controlled by the third inverter, a third switch controlled by the first inverter, a fourth switch controlled by the third NAND gate, and a fifth switch controlled by the second inverter, and wherein the selectively providing further includes using the first switch, the second switch, the third switch, the fourth switch, and the fifth switch to selectively provide the write current through the first portion of the plurality of magnetic storage cells.

11. The method of claim 10 wherein the plurality of switches further includes a sixth switch controlled by the first NAND gate, and wherein the selectively providing further includes:

utilizing the sixth switch and the third switch to selectively provide the read current through at least one of the first portion of the plurality of magnetic storage cells.

12. The method memory of claim 10 wherein each of the plurality of magnetic storage cells further includes a transistor controlled by a word line of the plurality of word lines.

13. The method of claim 10 wherein the plurality of word lines includes a first word line and a first word line complement for each of the plurality magnetic storage cells and wherein the selecting further includes:

enabling the second portion of the plurality of magnetic storage cells by enabling the first word line and the first word line complement.

14. The method of claim 13 wherein each of the plurality of magnetic storage cells further includes a first transistor controlled by the first word line and a second transistor controlled by the first word line complement.

15. A magnetic memory comprising:

a plurality of magnetic storage cells, each of the plurality of magnetic storage cells including at least one magnetic storage element capable of being programmed by a write current driven through the at least one magnetic storage element;

a bit line corresponding to the plurality of magnetic storage cells;

a plurality of word lines corresponding to the plurality of magnetic storage cells and for allowing current to flow through the plurality of magnetic storage cells;

bit line read/write logic corresponding to the bit line, the bit line read/write logic further including a first NAND gate having a first output, a second NAND gate having a second output, and a third NAND gate having a third output, and wherein the plurality of inverters further includes a first inverter having a first input coupled to the first output, a second inverter having a second input coupled to the second output, and a third inverter having a third input coupled to the third output; and a plurality of switches for the bit line, the plurality of switches including a first switch controlled by the second NAND gate, a second switch controlled by the third inverter, a third switch controlled by the first inverter, a fourth switch controlled by the third NAND gate, and a fifth switch controlled by the second inverter, the first switch, the second switch, the third switch, the fourth switch, and the fifth switch configured to selectively provide the write current through the plurality of magnetic storage cells.

* * * * *